(12) United States Patent  (10) Patent No.: US 7,835,154 B2
Kunkle et al. (45) Date of Patent: Nov. 16, 2010

(54) ELECTRONIC MODULE HAVING A LOCKING MEMBER AND SYSTEM INCLUDING SAME

(75) Inventors: Jonathan Kunkle, Irwin, PA (US); Edward Novack, New Kensington, PA (US)

(73) Assignee: Siemens Industry, Inc., Alpharetta, GA (US)

( * ) Notice: Subject to any disclaimer, the term of this patent is extended or adjusted under 35 U.S.C. 154(b) by 217 days.

(21) Appl. No.: 11/769,782

(22) Filed: Jun. 28, 2007

(65) Prior Publication Data

US 2008/0030962 A1 Feb. 7, 2008

Related U.S. Application Data

(60) Provisional application No. 60/817,870, filed on Jun. 30, 2006.

(51) Int. Cl.
*H05K 7/00* (2006.01)

(52) U.S. Cl. .................. 361/728; 361/801; 361/800

(58) Field of Classification Search .............. 361/728, 361/752, 790, 797, 800–803, 756, 727, 737, 361/788

See application file for complete search history.

(56) References Cited

U.S. PATENT DOCUMENTS

| | | | | |
|---|---|---|---|---|
| 5,222,897 | A | * | 6/1993 | Collins et al. ............... 439/157 |
| 5,277,615 | A | * | 1/1994 | Hastings et al. ............. 439/377 |
| 5,625,545 | A | | 4/1997 | Hammond |
| 5,659,680 | A | * | 8/1997 | Cunningham et al. ......... 714/25 |
| 5,805,420 | A | | 9/1998 | Burke |
| 6,038,126 | A | * | 3/2000 | Weng .................... 361/679.01 |
| 6,272,005 | B1 | | 8/2001 | Jensen et al. |
| 6,381,139 | B1 | * | 4/2002 | Sun ........................... 361/725 |
| 6,867,968 | B2 | * | 3/2005 | Katsuro et al. .............. 361/690 |
| 6,884,096 | B2 | * | 4/2005 | Centola et al. .............. 439/157 |
| 7,042,720 | B1 | * | 5/2006 | Konshak et al. ........ 361/679.33 |
| 7,379,303 | B2 | * | 5/2008 | Miyamura et al. .......... 361/715 |
| 7,602,617 | B2 | * | 10/2009 | Brandt et al. ............... 361/788 |
| 2005/0181650 | A1 | | 8/2005 | Chang |
| 2006/0067042 | A1 | | 3/2006 | Salinas et al. |
| 2008/0320182 | A1 | * | 12/2008 | Rugo et al. .................... 710/51 |

* cited by examiner

*Primary Examiner*—Hung S Bui
(74) *Attorney, Agent, or Firm*—Filip A. Kowalewski

(57) ABSTRACT

An electronic module. The electronic module includes a chassis and a locking member connected to the chassis. The locking member includes a handle portion, a curved portion, and a tab portion. The curved portion is adjacent the handle portion. The tab portion is opposite the curved portion.

20 Claims, 13 Drawing Sheets

ELECTRONIC MODULE HAVING A LOCKING MEMBER AND SYSTEM INCLUDING SAME

CROSS-REFERENCE TO RELATED APPLICATION

This application claims the priority benefit of United States Provisional Patent Application No. 60/817,870, filed on Jun. 30, 2006. This application is related to U.S. patent application Ser. No. 11/769,804, filed Jun. 28, 2007, entitled "Electronic Module and Interlocking Bus System Including Same ", to U.S. patent application Ser. No. 11/769,846, filed Jun. 28, 2007, entitled "Electronic Module Configured for Air Flow Therethrough and System Including Same", and to U.S. patent application Ser. No. 11/769,891, filed Jun. 28, 2007, entitled "Electronic Module Configured for Failure Containment and System Including Same ".

BACKGROUND

This application discloses an invention that is related, generally and in various embodiments, to an electronic module having a locking member.

Electronic modules come in a variety of shapes and sizes, and are utilized in a wide range of applications. For example, in some applications, the electronic modules form portions of a power supply. In general, the weight of each electronic module in a power supply varies with its overall size. For an electronic module having a higher weight, the higher weight makes it more difficult to install the electronic module in the desired position and/or remove the electronic module from the power supply.

Each electronic module which forms a portion of a power supply may accept three-phase AC input power and output a single-phase AC voltage. Thus, for such applications, five electrical connections (three input and two output) are required for each electronic module.

When the five electrical connections are realized using power wiring connected directly to the respective electronic modules, the labor-intensive process of making the electrical connections tends to increase the overall cost of the power supply. Also, when an electronic module having the power wiring connected directly thereto requires replacement, the labor intensive process of disconnecting the power wiring tends to increase the relative cost associated with replacing the electronic module.

SUMMARY

In one general respect, this application discloses an electronic module. According to various embodiments, the electronic module includes a chassis and a locking member connected to the chassis. The locking member includes a handle portion, a curved portion, and a tab portion. The curved portion is adjacent the handle portion. The tab portion is opposite the curved portion.

In another general respect, this application discloses a system. According to various embodiments, the system includes an electronic module and first and second module support rails in contact with the electronic module. The electronic module includes a chassis and a locking member connected to the chassis. The locking member includes a handle portion, a curved portion, and a tab portion. The curved portion is adjacent the handle portion. The tab portion is opposite the curved portion.

DESCRIPTION OF DRAWINGS

Various embodiments of the invention are described herein by way of example in conjunction with the following figures.

DETAILED DESCRIPTION

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Figure 1:
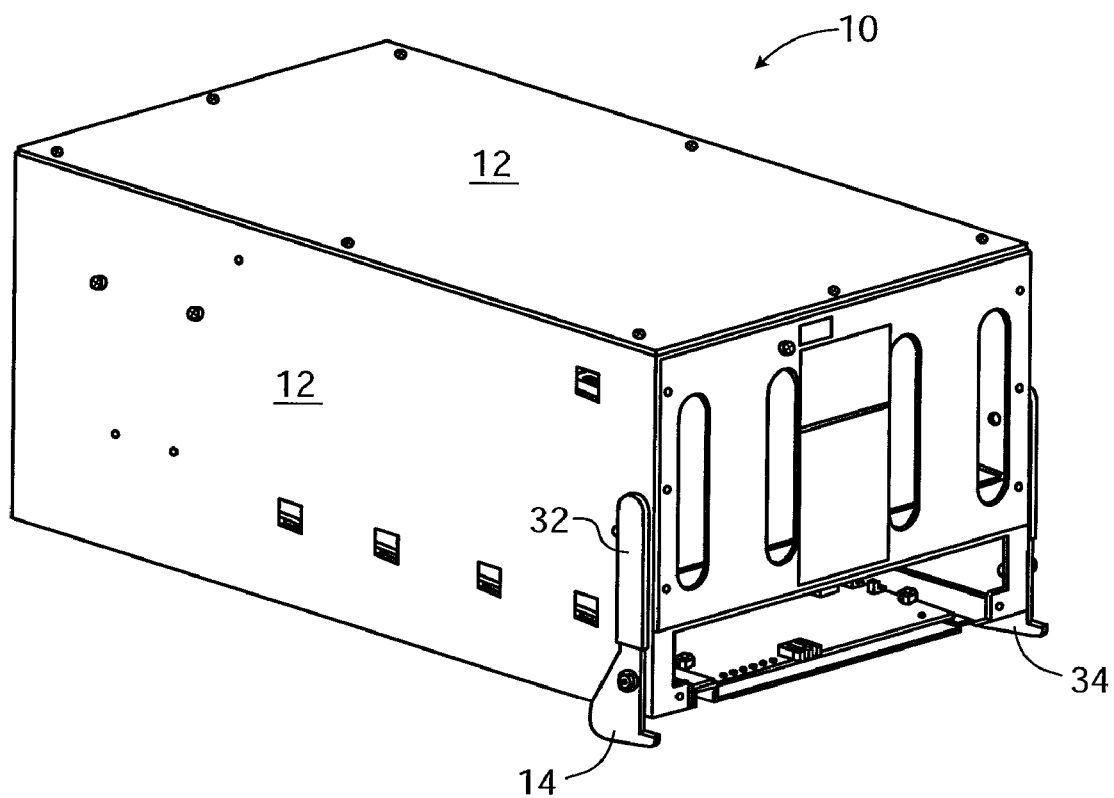
FIG. 1 illustrates various embodiments of an electronic module.

FIG. 1 illustrates various embodiments of an electronic module 10. The electronic module 10 may be implemented as any type of module such as, for example, a power cell, a power supply, an inverter, a drive chassis, etc. According to various embodiments, the electronic module 10 is implemented as a power cell which accepts three phase AC input power and outputs a single phase AC voltage. Such a power cell is described in U.S. Pat. No. 5,625,545 (Hammond), and includes an AC-to-DC rectifier, a smoothing circuit, an output DC-to-AC converter, and a control circuit.

The electronic module 10 includes a chassis 12 and a locking member 14 connected to the chassis 12. According to various embodiments, the chassis 12 may be comprised of several portions connected together (e.g., a top, a bottom, and four sides), and one or more portions of the chassis 12 may be removable. The chassis 12 defines an exterior portion of the electronic module 10, and encloses various components (e.g., any or all of the following: capacitors, printed circuit boards, heat sink, etc.) of the electronic module 10. The chassis 12 may be fabricated from any suitable material. For example, according to various embodiments, the chassis 12 is fabricated from a conductive material such as, galvanized steel. For such embodiments, the conductive material of the chassis 12 may serve to provide a low impedance path for arcing faults within the chassis 12 to minimize potential damage caused thereby. The chassis 12 may be of a thickness sufficient to prevent any debris resulting from a failure of an internal component of the electronic module 10 from exiting the space enclosed by the chassis 12, thereby preventing any collateral damage to other components in the vicinity of the electronic module 10. In addition, the chassis 12 may serve to protect internal components of the electronic module 10 from damage during shipping and handling, and may be configured in a manner such that the electronic module 10 can be placed on any of its sides without causing any damage to the components of the electronic module 10. Furthermore, the chassis 12 may also define an air plenum utilized to assist in the forced air cooling of all components within the chassis 12.

Figure 2:
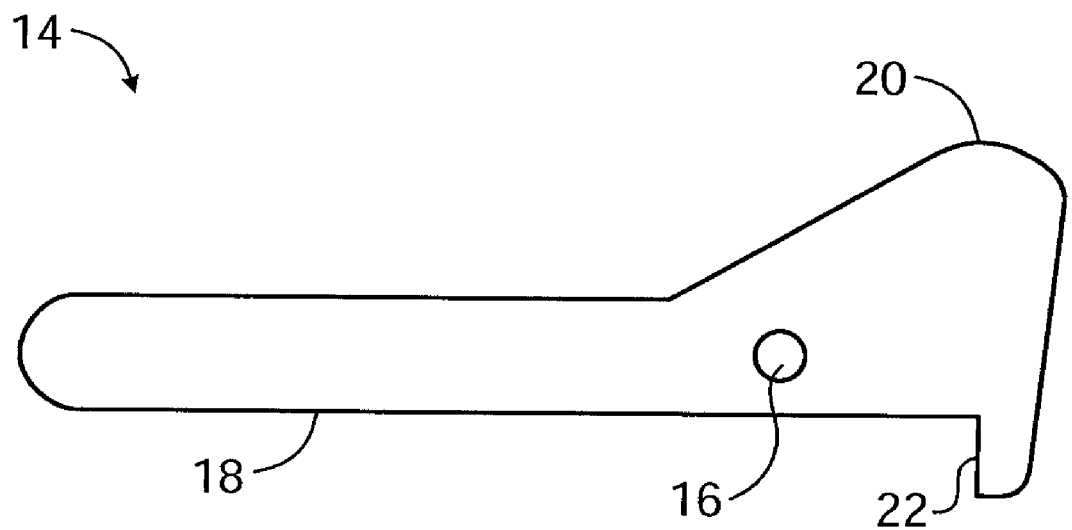
FIG. 2 illustrates various embodiments of a locking member of the electronic module of FIG. 1.

FIG. 2 illustrates various embodiments of the locking member 14. The locking member 14 defines an opening 16 and includes a handle portion 18, a curved portion 20, and a tab portion 22. As shown in FIG. 2, the curved portion 20 is adjacent the handle portion 18, and the tab portion 22 is opposite the curved portion 20. The locking member 14 may be fabricated from any suitable material such as, for example, galvanized steel. The handle portion 18, the curved portion 20 and the tab portion 22 may be fabricated separately or integral with one another.

Figure 3:
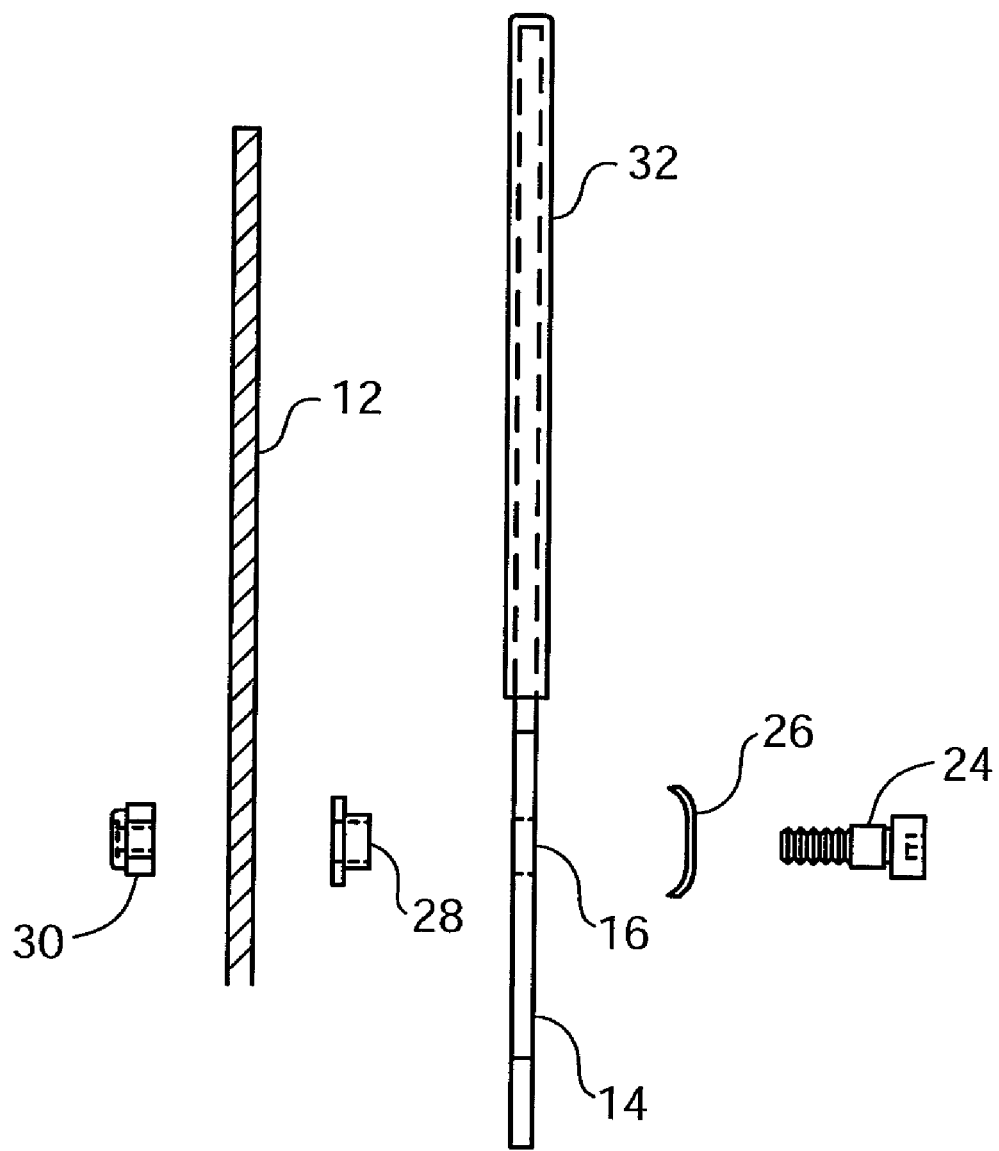
FIG. 3 illustrates various embodiments of a connection between a locking member and a chassis of the electronic module of FIG. 1.

The locking member 14 may be connected to the chassis 12 in any suitable manner. For example, the locking member 14 may be rotatably connected to one of the sides of the chassis 12. FIG. 3 illustrates various embodiments of a rotatable connection between the locking member 14 and the chassis 12. For such embodiments, the rotatable connection is made with a shoulder screw 24 that passes through a spring washer 26, through the opening 16, through a shoulder washer 28 positioned between the first locking member 14 and the chassis 12, through an opening in the chassis 12, and is threadedly connected to nut 30. According to various embodiments, the nut 30 is a self-clinching nut that is connected to the chassis 12. The shoulder washer 28 allows the locking member 14 to rotate while remaining connected to the chassis 12 and the spring washer 26 provides rotational resistance to the locking member 14.

The handle portion 18 may be of any shape suitable for gripping by a human hand. For example, according to various embodiments, the shape of the handle portion 18 may be an elongated shape having a substantially rectangular cross-section. According to various embodiments, the locking member 14 may also include a covering 32 (see FIG. 1) on the handle portion 18. The covering 32 may serve to protect a user against any sharp edges and may be fabricated from any suitable material such as, for example, a rubber, a vinyl, a plastic, etc. The curved portion 20 and the tab portion 22 may be of any shape suitable for cooperating to install, secure or remove the electronic module 10 from a system such as, for example, a power supply. According to various embodiments, the curved portion 20 is generally cam-shaped, and the tab portion 22 is generally rectangular-shaped.

Returning to FIG. 1, according to various embodiments, the electronic module 10 also includes a second locking member 34 connected to the chassis 12. The second locking member 34 may be identical to the locking member 14. Thus, the second locking member 34 may include a handle portion, a curved portion adjacent the handle portion, a tab portion opposite the curved portion, and a covering on the handle portion. Additionally, the second locking member 34 may be connected to the chassis 12 in a manner identical to that described with respect to the locking member 14. Thus, the second locking member 34 may be rotatably connected to the chassis 12. As shown in FIG. 1, the locking member 14 and the second locking member 34 are connected to opposite sides of the electronic module 10.

Figure 4:
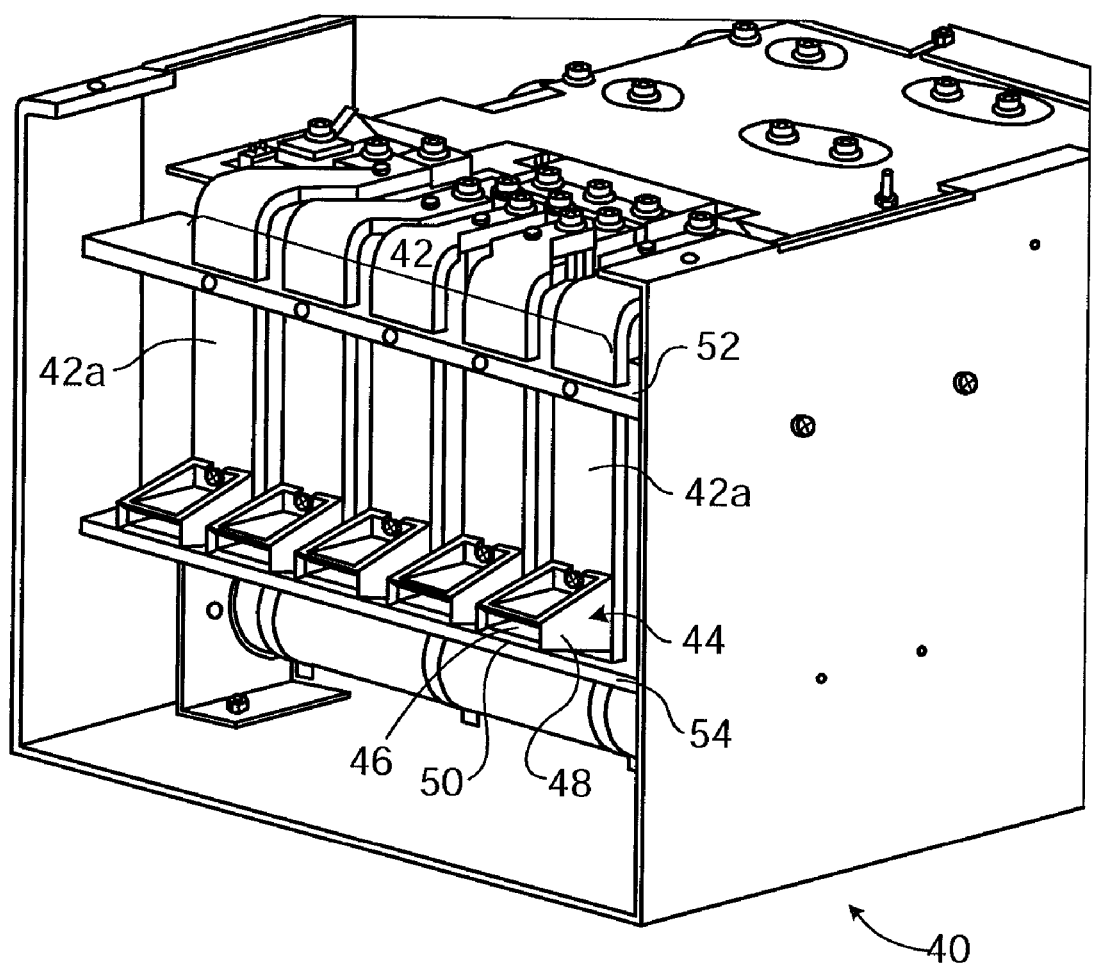
FIG. 4 illustrates various embodiments of an electronic module.

FIG. 4 illustrates various embodiments of an electronic module 40. According to various embodiments, the electronic module 40 includes all of the features described with respect to the electronic module 10 of FIG. 1. The electronic module 40 includes a bus bar system 42 and a power plug connector 44 connected to the bus bar system 42. The bus bar system 42 includes a plurality of bus bars 42a. The respective bus bars may be fabricated from any suitable conductive material, and are collectively configured to route power to and from the electronic module 10. At least two of the bus bars 42a are configured as input bus bars and at least two of the bus bars 42a are configured as output bus bars. The number, size and shape of the bus bars 42a can vary by application. In general, the respective bus bars 42a are sized to accommodate requirements associated with a particular application.

The power plug connector 44 includes a conductive material 46 and a housing 48 which surrounds the conductive material 46. The conductive material 46 may be fabricated from any suitable conductor such as, for example, copper. The housing 48 may be fabricated from any suitable insulating material such as, for example, a plastic. The housing 48 defines an opening configured to receive a portion of a system bus when the electronic module 40 is connected to the system bus. The opening surrounds the conductive material 46, and the conductive material 46 defines a smaller opening configured to receive the portion of the system bus when the electronic module 40 is connected to the system bus. Thus, the housing 48 and the conductive material 46 collectively define an opening 50 which is sized to receive the portion of the system bus when the electronic module 40 is connected to the system bus.

The power plug connector 44 may be connected to the bus bar system 42 in any suitable manner. For example, according to various embodiments, the power plug connector 44 is mechanically connected to the bus bar system 42 via fasteners (e.g., screws or nuts and bolts) in a manner that places the conductive material 46 in direct contact with the bus bar system 42. Thus, the bus bar system 42 may also act as a heat sink for the power plug connector 44. The power plug connector 44 is configured such that it can be connected to the bus bar system 42 in a manner that the permits some movement of the power plug connector 44. As shown in FIG. 4, the electronic module 40 may include a plurality of power plug connectors 44 connected to the bus bar system 42.

According to other embodiments, the power plug connectors may be configured in a different manner. For example, according to various embodiments, a given power plug connector may include a male portion and a separate female portion which collectively function to connect the electronic module 40 to the system bus. For some embodiments, the male portion is connected to bus bar system 42 and the female portion is connected to the system bus. In other embodiments, the male portion is connected to system bus and the female portion is connected to the bus bar system 42. In general, for a given application, the particular configuration of power plug connectors are selected to accommodate requirements associated with a particular application.

According to various embodiments, the electronic module 40 also includes a bus bar system support 52. The bus bar system support 52 may be fabricated from any suitable nonconductive material such as, for example, a plastic, a fiberglass, etc., and may serve to reduce mechanical stresses on components within the electronic module 40. The bus bar system support 52 may also serve to align the various bus bars 42a of the bus bar system 42 and provide mechanical support thereto. According to various embodiments, the electronic module 40 also includes a second bus bar system support 54 as shown in FIG. 4. The second bus bar system support 54 may be similar to the bus bar system support 52 and may provide similar functionality.

Figure 5A:
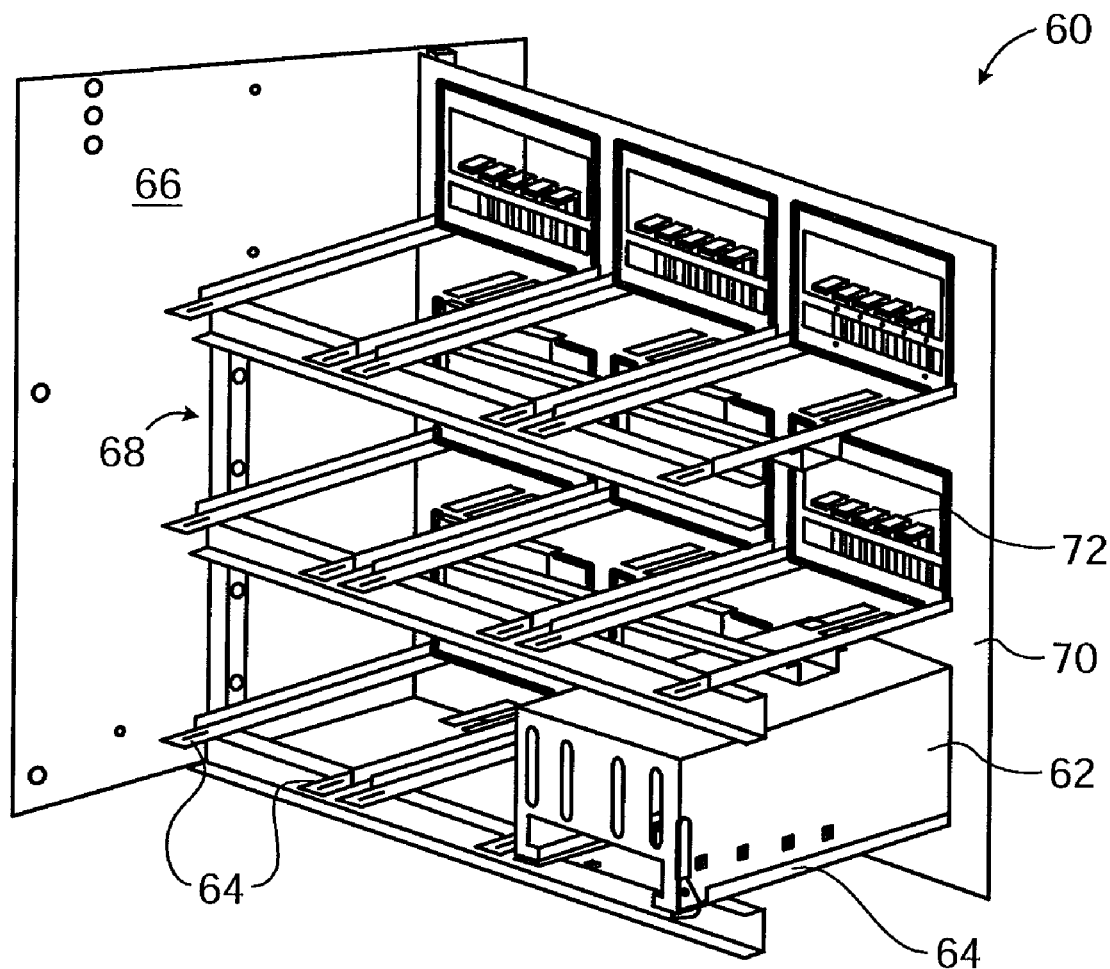
FIGS. 5A and 5B illustrate various embodiments of a system.
Figure 5B:
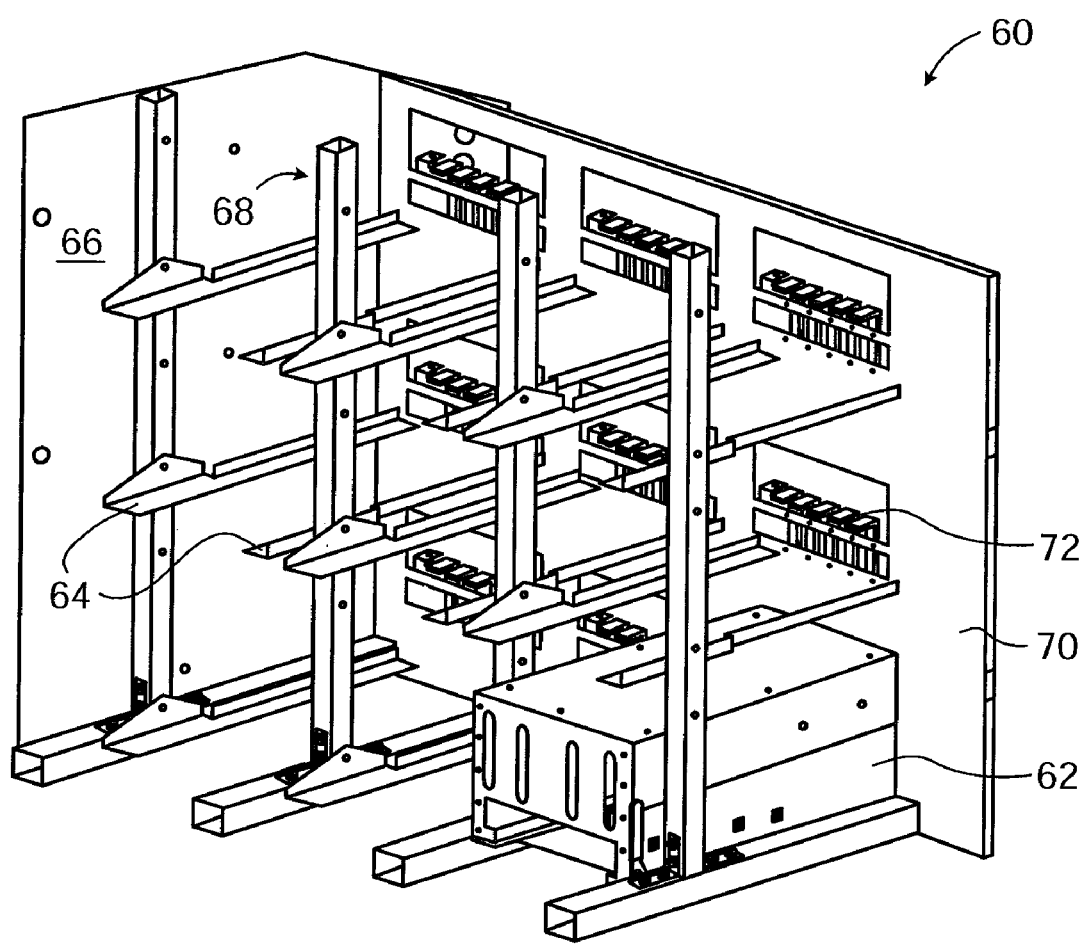

FIGS. 5A and 5B illustrate various embodiments of a system 60. The system 60 may be utilized in a variety of applications. For example, the system 60 may be utilized as a power supply. The system 60 includes an electronic module 62. According to various embodiments, the electronic module 62 includes all of the features described with respect to the electronic module 10 of FIG. 1 and/or the electronic module 40 of FIG. 4. According to various embodiments, the system 60 may include any number of electronic modules 62. For example, according to various embodiments, the system 60 may include anywhere from one to twenty-four electronic modules 62. For purposes of clarity only one electronic module 62 is shown in FIG. 5A and only one electronic module 62 is shown in FIG. 5B.

The system 60 also includes a plurality of module support rails 64. The module support rails 64 are arranged in pairs, with one module support rail 64 of the pair being a mirror-image of the other module support rail 64. Each pair of the module support rails 64 are in contact with and provides mechanical support for a given electronic module 62 once the given electronic module 62 is installed in the system 60. The module support rails 64 also serve to guide the path of the electronic modules 62 when loading or unloading the electronic modules 62 into or out of the system 60, to prevent side to side movement of the electronic modules 62 once the electronic modules 62 are installed in the system 60, and to help hold the electronic modules 62 in place once they are installed in the system 60. The module support rails 64 may be fabricated from any suitable material. For example, according to various embodiments, the module support rails 64 are fabricated from a conductive material (e.g., a metal). According to other embodiments, the module support rails 64 are fabricated from a non-conductive material (e.g., a non-metallic material). Various embodiments of the module support rails 64 are described in more detail hereinbelow with respect to FIG. 6.

The system 60 may also include a system enclosure 66, an enclosure support structure 68, a backplane 70, and a system bus 72. For purposes of clarity, only a portion of the system enclosure 66 is shown in FIGS. 5A and 5B. The system enclosure 66 may be fabricated from any suitable material such as, for example, galvanized steel. The system enclosure 66 serves to enclose the various components of the system 60, may define any number of openings or knockouts (e.g., for power and control connections), and may include any number of hinged or removable panels that provide for access to and maintenance of the various components within the system enclosure 66.

The enclosure support structure 68 is positioned within and connected to the system enclosure 66. The enclosure support structure 68 may be connected to the system enclosure 66 in any suitable manner. For example, according to various embodiments, the enclosure support structure 68 may be removably connected to the system enclosure 66 via mechanical fasteners. According to other embodiments, the enclosure support structure 68 may be welded to the system enclosure 66. The enclosure support structure 68 may be configured in a horizontal arrangement as shown in FIG. 5A or in a vertical arrangement as shown in FIG. 5B. For a given size electronic module 62, the vertical arrangement of the enclosure support structure 68 may be utilized to keep the overall height of the system 60 lower than if a horizontal arrangement of the enclosure support structure 68 was utilized.

The backplane 70 may be fabricated from any suitable non-conductive material. According to various embodiments, the backplane 70 is fabricated from a high-strength non-conductive laminate material. The backplane 70 may be connected to the enclosure support structure 68 via mechanical fasteners such as screws or nuts and bolts. The backplane 70 defines a number of openings configured to allow visual inspection of the connections between the power plug connectors of the electronic module 62 and the system bus 72. The backplane 70 also defines a number of openings (e.g., slots or slits) configured to receive a portion of the module support rails 64 as described in more detail hereinbelow.

Figure 6:
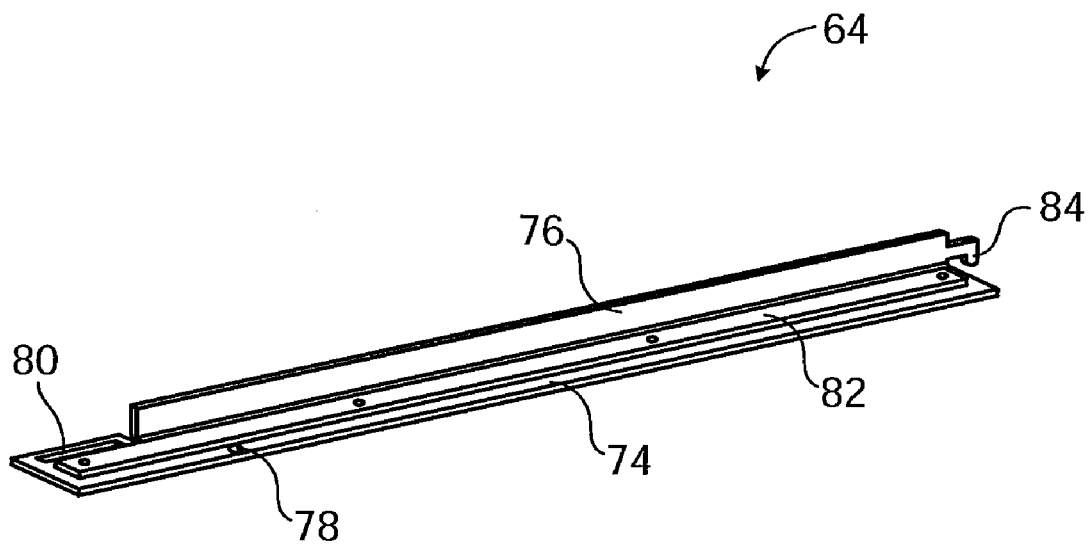
FIG. 6 illustrates various embodiments of a module support rail of the system of FIG. 5A.

FIG. 6 illustrates various embodiments of one of the module support rails 64 of the system 60 of FIG. 5A. According to various embodiments, each module support rail 64 includes a first section 74, and a second section 76 oriented substantially normal to the first section 74. The first section 74 defines an opening 78 configured to align with an opening of the enclosure support structure 68 to facilitate connection of a module support rail 64 to the enclosure support structure 68. The first section 74 also defines one or more openings 80 configured to receive the tab portion and the curved portion of the locking member of the electronic module 62 and/or the tab portion and the curved portion of the second locking member of the electronic module 62. According to various embodiments, the one or more openings 80 are configured as slots or slits. Each module support rail 64 may also include a low friction material 82 such as, for example, polyethylene, attached to the first section 74. The low friction material 82 serves to minimize the effort needed to load/unload the electronic module 62 into or out of the system 60.

The second section 76 includes a portion 84 configured to pass through an opening (e.g., a slot or a slit) defined by the backplane 70 and provide an interlocked connection therewith. According to various embodiments, the portion 84 may be a generally hook-shaped portion as shown in FIG. 6. For enclosure support structures 68 utilizing a vertical arrangement as shown in FIG. 5B, the second section 76 defines an opening similar to opening 78 and configured to align with an opening of the enclosure support structure 68 to facilitate connection of the module support rail 64 to the enclosure support structure 68.

Figure 7A:
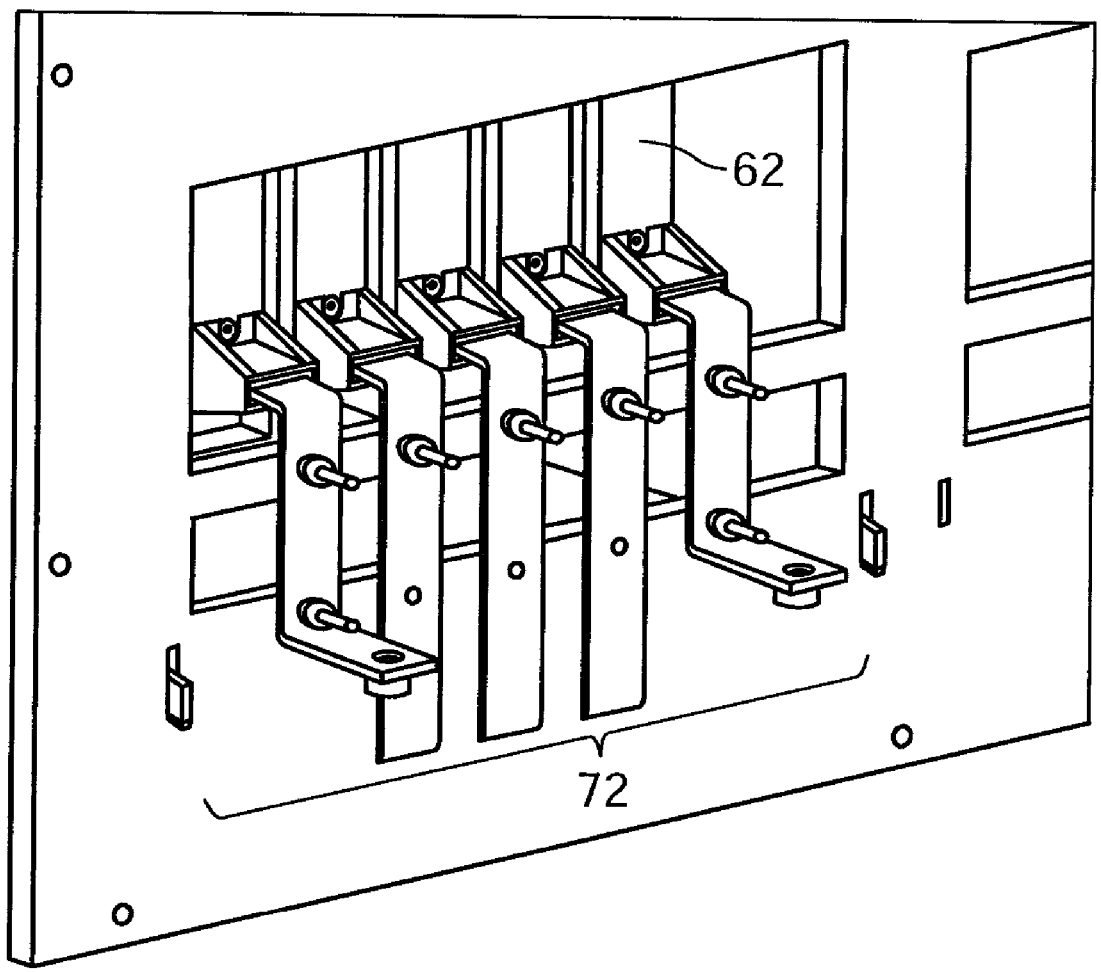
FIGS. 7A and 7B illustrate various embodiments of a system bus of the system of FIG. 5A.
Figure 7B:
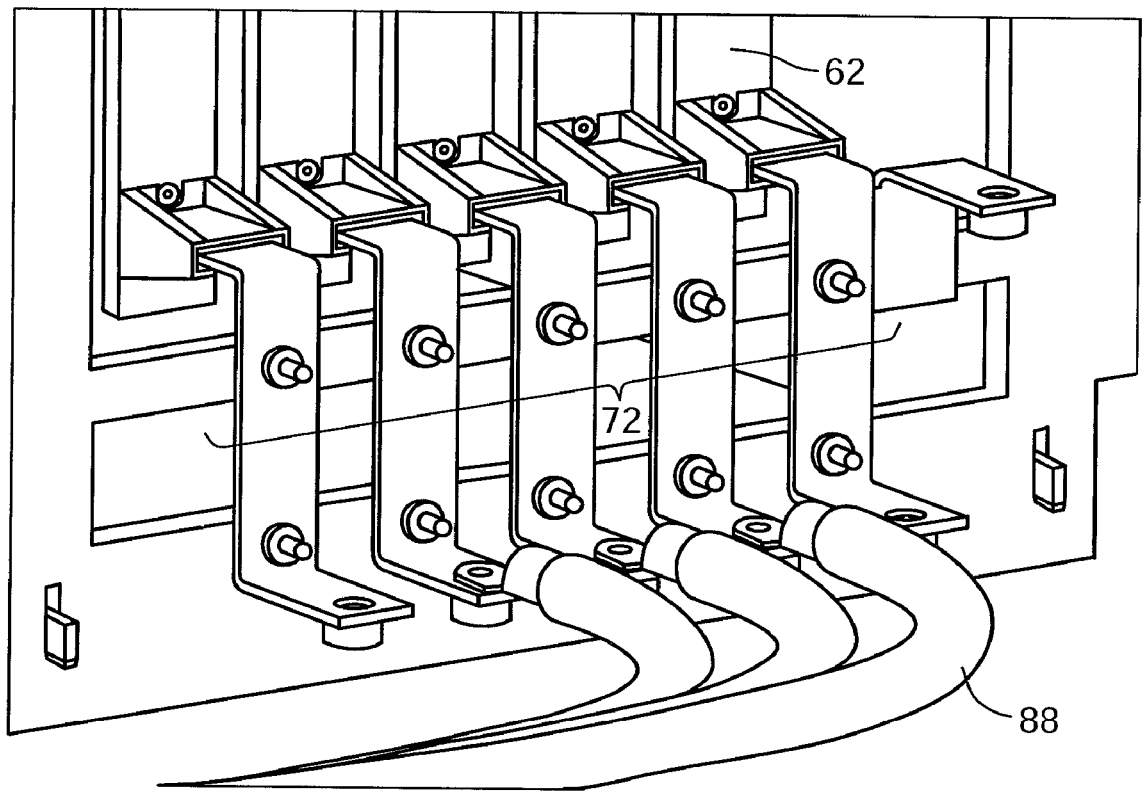
Figure 8:
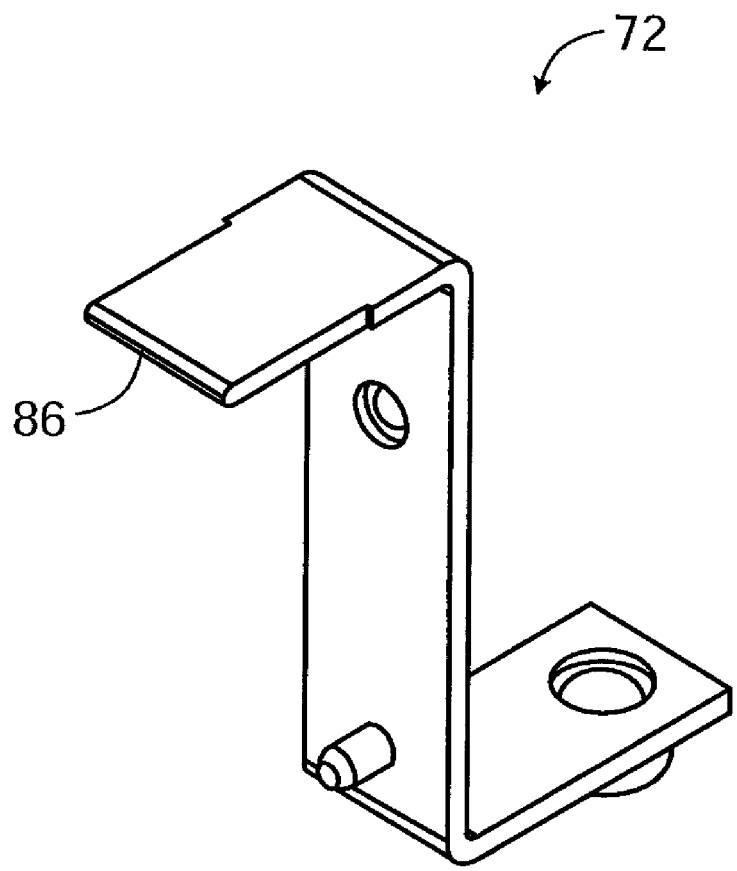
FIG. 8 illustrates various embodiments of a portion of the system bus of FIG. 7A.

FIGS. 7A and 7B illustrate various embodiments of the system bus 72 of the system 60 of FIG. 5A. Each respective portion of the system bus 72 may be connected to the backplane 70 in at least two different locations via fasteners such as screws or nuts and bolts. The system bus 72 is configured to mate with the power plug connectors of the electronic module 62 when the electronic module 62 is installed into the system 60. As shown in FIG. 8, the portions 86 of the system bus 72 that mate with the power plug connectors of the electronic module 62 may be radiused or chamfered. When an electronic module 62 is being connected to the system bus 72, the radiused or chamfered portions 86 of the system bus 72 serve to minimize any potential mechanical damage to the respective housings of the power plug connectors resulting from any misalignment between the power plug connectors and the system bus 72. The combination of the radiusing or chamfering of the portions 86 of the system bus 72 and the manner that the power plug connectors are connected to the bus bar system of the electronic module 62 allows for the proper electrical connections to be made between the system bus 72 and the bus bar system even when the system bus 72 and the power plug connectors are misaligned with one another. For example, according to various embodiments, the proper electrical connections will still be made between the system bus 72 and the bus bar system of the electronic module 62 if the misalignment between the system bus 72 and any of the power plug connectors is approximately six degrees or less in all directions.

The system bus 72 may be fabricated from any suitable conductive material. For example, according to various embodiments, the system bus 72 is fabricated from copper or aluminum, and is coated with nickel plating or silver plating proximate the radiused or chamfered portions 86. According to various embodiments an electrical lubricant is applied to the system bus 72 proximate the radiused or chamfered portions 86. As shown in FIG. 7B, wire 88 or additional bus may be utilized to connect the system bus 72 to other components of the system 60.

Figure 9A:
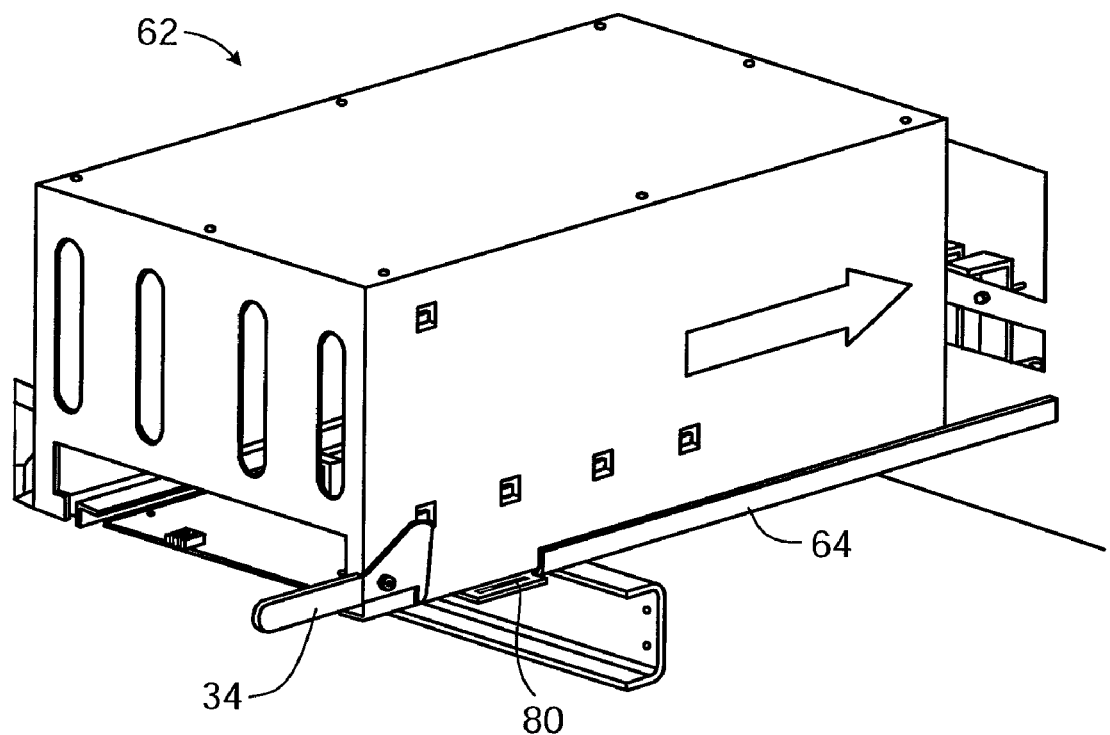
FIGS. 9A-9C illustrate an electronic module of the system of FIG. 5A at various stages of the process for loading the electronic module into the system.
Figure 9B:
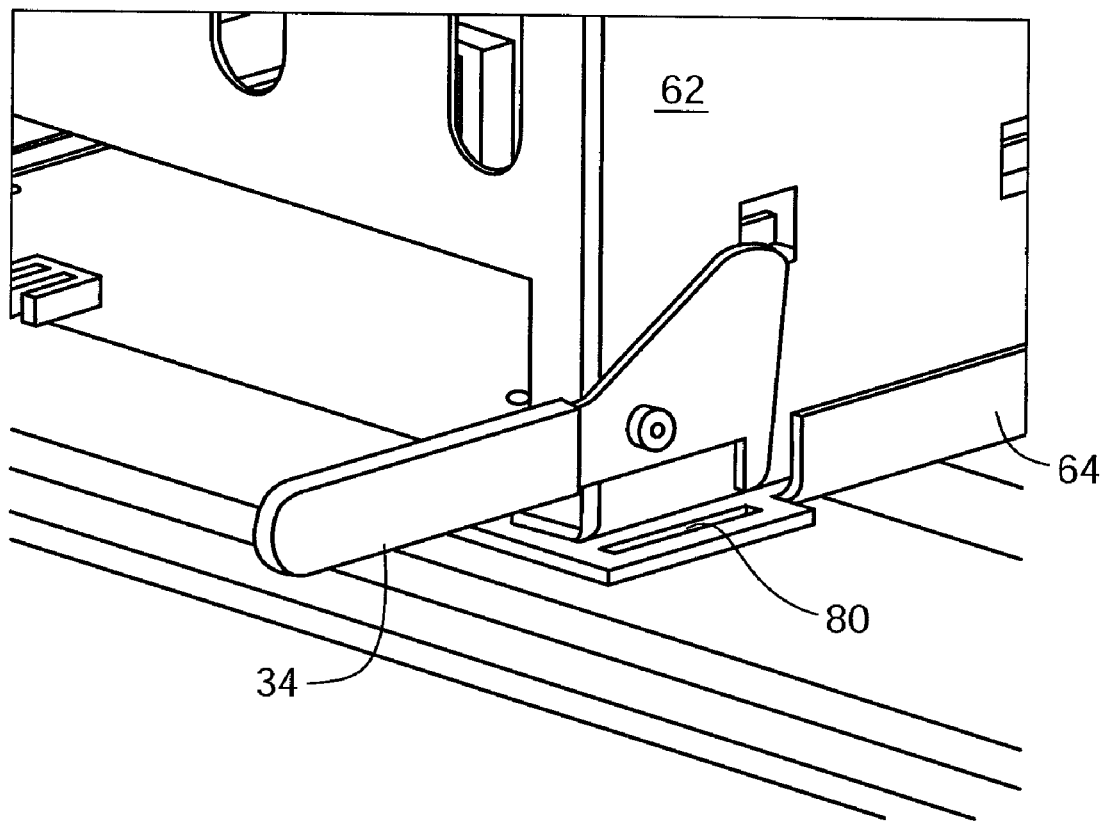
Figure 9C:
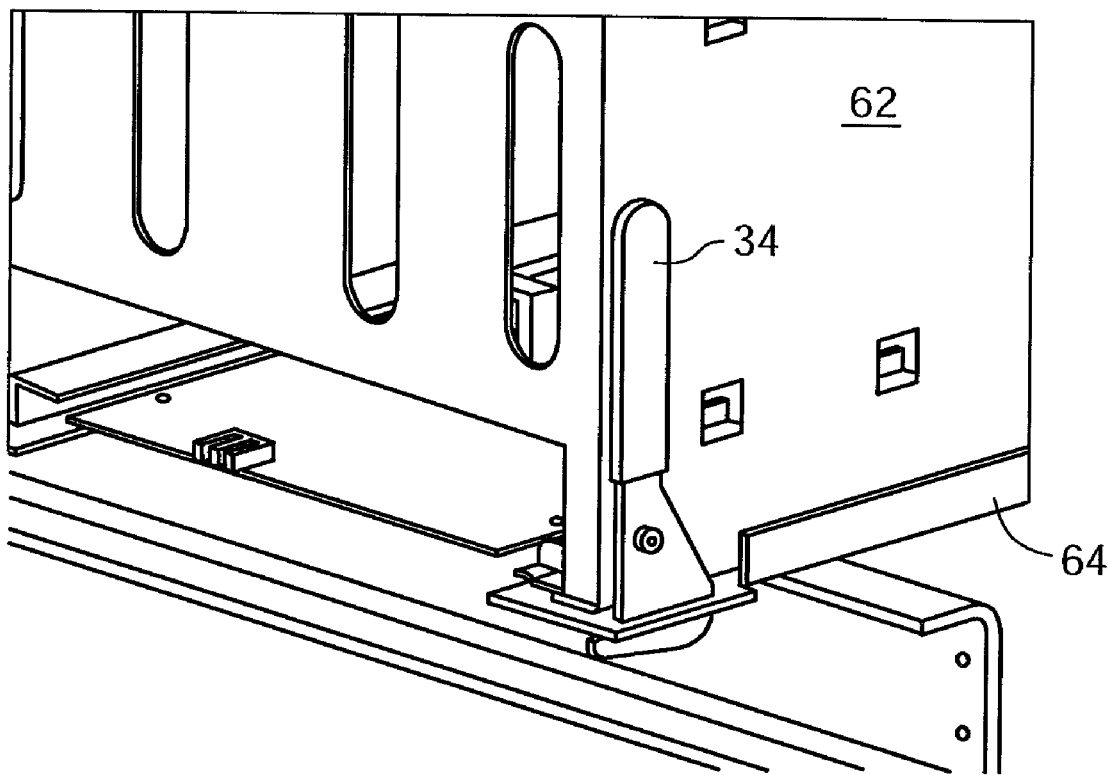

FIGS. 9A-9C illustrate the electronic module 62 at various stages of the process for loading the electronic module 62 into the system of FIG. 5A. As shown in FIG. 9A, the electronic module 62 has been placed on the respective first sections of a pair of module support rails 64, and the handle portion of the locking member 34 has been rotated toward the "front" of the electronic module 62 to a "horizontal" position such that the tab portion of the locking member 34 is positioned at or above the "bottom" of the electronic module 62. The handle portion may be rotated before or after the electronic module 62 has been placed on the respective first sections. As the electronic module 62 is moved along the low friction material on the respective first sections toward the "back" of the system enclosure, the tab portion will approach alignment with the opening 80 (e.g., slit or slot) defined by the first section of the module support rail 64 as shown in FIG. 9B. Once the tab portion is aligned with the opening 80, the handle portion is rotated "upward" toward a "vertical" position as shown in FIG. 9C. As the handle portion rotates "upward", the curved portion also rotates and cooperates with the first section to cause the power plug connectors to begin to mate with the system bus. As the curved portion rotates, the tab portion also rotates. When the rotation of the handle portion to the "vertical" position is completed, the power plug connectors are filly mated with the system bus, and the electronic module 62 is locked into place by the cooperation of the tab portion and the first section. For embodiments where the electronic module 62 also includes a second locking member, the above-described process is similar, but the rotation of the locking member is accompanied by the concurrent rotation of the second locking member.

The process for unloading the electronic module 62 from the system is the opposite of the loading process described hereinabove. For example, the locking member 34 may be rotated from the "vertical" position to the "horizontal" position, thereby cooperating with the first section to cause the power plug connectors to disengage from the system bus. The electronic module 62 may then be moved along the low friction material on the respective first sections toward the "front" of the system enclosure and removed from the system.

While several embodiments of the invention have been described herein by way of example, those skilled in the art will appreciate that various modifications, alterations, and adaptions to the described embodiments may be realized without departing from the spirit and scope of the invention defined by the appended claims.

What is claimed is:

1. An electronic module, comprising:
a chassis;
a plurality of bus bars;
a plurality of electrical connectors configured to establish electrical connections between the electronic module and a system bus, the system bus configured to receive a plurality of electronic modules and route power to and from the plurality of electronic modules via the plurality of bus bars, wherein at least a portion of the bus bars are configured as input bus bars and at least a portion of the bus bars are configured as output bus bars, and wherein each of the plurality of bus bars is operably connected to the system bus via at least one of the plurality of electrical connectors establishing a connection between each of the bus bars and the system bus, thereby operably connecting the electronic module and the system bus; and
a locking member connected to the chassis, wherein the locking member comprises:
a handle portion;
a curved portion adjacent the handle portion; and
a tab portion opposite the curved portion;
wherein the locking member is configured to lock the electronic module to a power system such that the at least one electrical connector establishes the electrical connection with at least one input bus bar and the system bus, and at least one output bus bar and the system bus when the locking member is in a locked position.

2. The electronic module of claim 1, wherein the chassis defines an exterior portion of the electronic module.

3. The electronic module of claim 1, wherein the chassis encloses at least one component of the electronic module.

4. The electronic module of claim 1, wherein the chassis is fabricated from a conductive material.

5. The electronic module of claim 1, wherein the locking member is rotatably connected to the chassis.

6. The electronic module of claim 1, wherein the handle portion is elongated.

7. The electronic module of claim 1, further comprising a covering on the handle portion.

8. The electronic module of claim 1, further comprising a second locking member connected to the chassis.

9. The electronic module of claim 8, wherein the second locking member is rotatably connected to the chassis.

10. The electronic module of claim 8, wherein the locking member and the second locking member are connected to opposite sides of the electronic module.

11. The electronic module of claim 8, wherein the second locking member comprises:
a handle portion;
a curved portion adjacent the handle portion of the second locking member; and
a tab portion opposite the curved portion of the second locking member.

12. The electronic module of claim 11, wherein the handle portion of the second locking member is elongated.

13. The electronic module of claim 11, further comprising a covering on the handle portion of the second locking member.

14. A system, comprising:
an electronic module; and
first and second module support rails in contact with the electronic module, wherein the electronic module comprises:
a chassis;
a plurality of bus bars:
a plurality of electrical connectors configured to establish electrical connections between the electronic module and a system bus, the system bus configured to receive a plurality of electronic modules and route power to and from the plurality of electronic modules via the plurality of bus bars, wherein at least a portion of the bus bars are configured as input bus bars and at least a portion of the bus bars are configured as output bus bars, and wherein each of the plurality of bus bars is operably connected to the system bus via at least one of the plurality of electrical connectors establishing a connection between each of the bus bars and the system bus, thereby operably connecting the electronic module and the system bus; and a locking member connected to the chassis, wherein the locking member comprises:
   a handle portion;
   a curved portion adjacent the handle portion; and
   a tab portion opposite the curved portion;

wherein the locking member is configured to lock the electronic module to a power system such that the at least one electrical connector establishes the electrical connection with at least one input bus bar and the system bus, and at least one output bus bar and the system bus when the locking member is in a locked position.

15. The system of claim 14, wherein the system is a power supply.

16. The system of claim 14, wherein the locking member is rotatably connected to the chassis.

17. The system of claim 14, further comprising a covering on the handle portion.

18. The system of claim 14, further comprising a second locking member connected to the chassis.

19. The system of claim 18, wherein the second locking member is rotatably connected to the chassis.

20. The system of claim 18, wherein the locking member and the second locking member are connected to opposite sides of the electronic module.

* * * * *